United States Patent [19]

Pfiester

[11] Patent Number: 5,204,281
[45] Date of Patent: Apr. 20, 1993

[54] METHOD OF MAKING DYNAMIC RANDOM ACCESS MEMORY CELL HAVING A TRENCH CAPACITOR

[75] Inventor: James R. Pfiester, Austin, Tex.

[73] Assignee: Motorola, Inc., Schaumburg, Ill.

[21] Appl. No.: 576,872

[22] Filed: Sep. 4, 1990

[51] Int. Cl.⁵ ........................................... H01L 21/70
[52] U.S. Cl. ...................................... 437/52; 437/47; 437/48; 437/60; 437/203; 437/233; 437/919; 257/296
[58] Field of Search .................. 437/47, 48, 51, 52, 437/60, 84, 191, 203, 228, 233, 235, 919; 357/23.4, 23.6, 51

[56] References Cited

U.S. PATENT DOCUMENTS

| | | | |
|---|---|---|---|
| 4,649,625 | 3/1987 | Lu | 437/60 |
| 4,683,486 | 7/1987 | Chatterjee | 357/23.6 |
| 4,686,552 | 8/1988 | Teng et al. | 357/23.6 |
| 4,728,623 | 3/1988 | Lu et al. | 437/60 |
| 4,761,385 | 8/1988 | Pfiester | 437/60 |
| 4,785,337 | 11/1988 | Kenney | 357/23.6 |
| 4,788,158 | 11/1988 | Chatterjee | 437/203 |
| 4,791,463 | 12/1988 | Malhi | 357/23.6 |
| 4,794,434 | 12/1988 | Pelley, III | 357/23.6 |
| 4,843,025 | 6/1989 | Morita | 437/47 |
| 4,864,374 | 9/1989 | Banerjee | 357/23.6 |
| 4,864,375 | 9/1989 | Teng et al. | 357/23.6 |
| 4,907,047 | 3/1990 | Kato et al. | 357/23.6 |
| 4,914,739 | 4/1990 | Malhi | 357/23.6 |
| 4,921,816 | 5/1990 | Ino | 437/52 |
| 5,034,341 | 7/1991 | Itoh | 437/203 |

FOREIGN PATENT DOCUMENTS

| | | | |
|---|---|---|---|
| 0026637 | 2/1980 | Japan . | |
| 0095366 | 7/1980 | Japan . | |
| 0036851 | 2/1987 | Japan | 357/23.6 |

OTHER PUBLICATIONS

IBM TDB, vol. 22, No. 813, Jan. 1980, Vertical FET Random-Access Memories with Deep Trench Isolation.

Primary Examiner—Tom Thomas
Attorney, Agent, or Firm—Jasper W. Dockrey

[57] ABSTRACT

A trench is formed in a substrate and lined with a dielectric. A first silicon layer of a first conductivity is deposited in the trench. A second silicon layer of a second conductivity type is deposited over the first layer and a third silicon layer of the first conductivity type is deposited on the second layer, all are disposed within the trench area. A second trench is then formed through the third and second layers and into the first layer. The second trench is then lined with a dielectric and filled with a gate polysilicon. The appropriate connections are then made to the gate, the third layer, and the substrate.

15 Claims, 2 Drawing Sheets

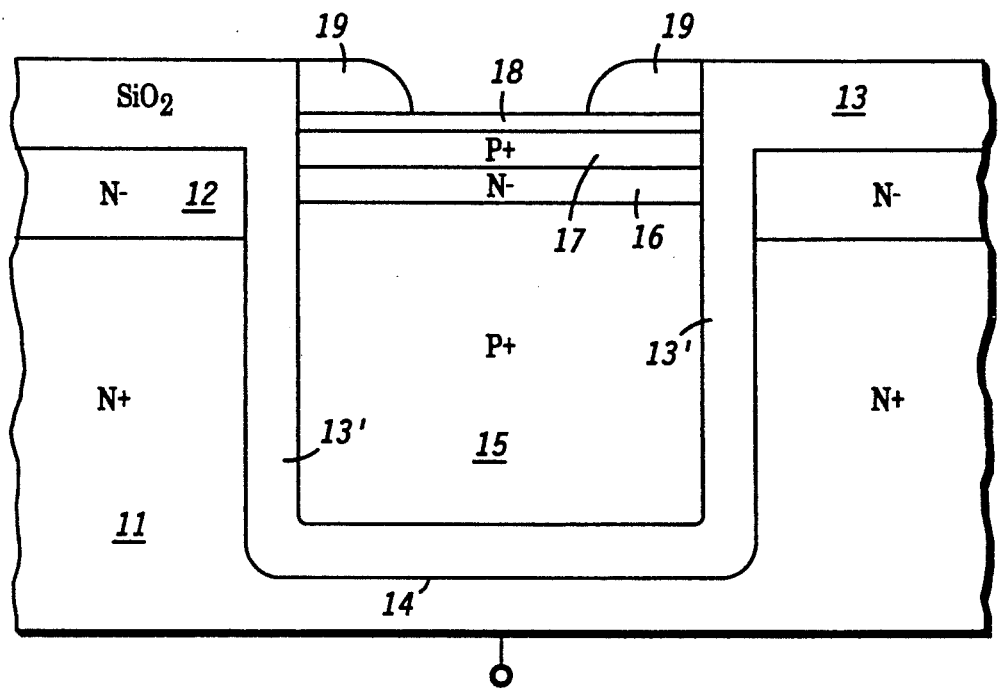
FIG. 1A
FIG. 1B
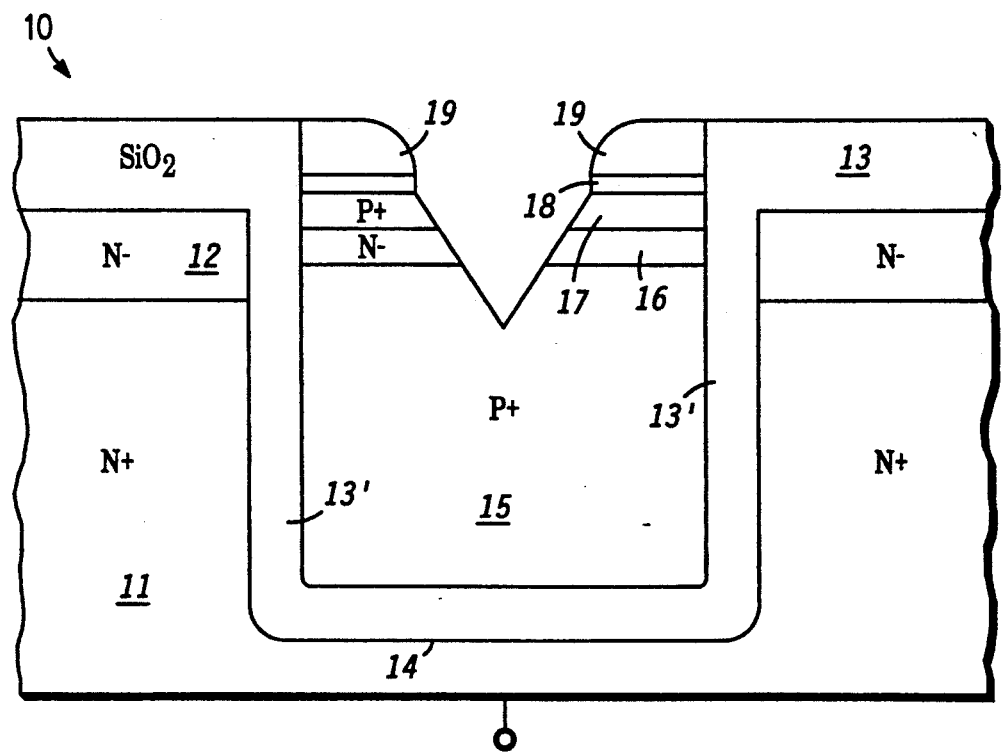

5,204,281

METHOD OF MAKING DYNAMIC RANDOM ACCESS MEMORY CELL HAVING A TRENCH CAPACITOR

BACKGROUND OF THE INVENTION

The present invention relates, in general, to dynamic random access memory (DRAM) cells and, more particularly, to a DRAM cell having a trench capacitor.

Various types of DRAM cells are known in the industry. With the increased density of DRAM arrays, the use of trench cells are becoming more prevalent. However, existing trench cell technology has also become a limiting factor in the number of cells that can be placed in an array. For example, trench capacitors were originally formed adjacent the accompanying transistor, such as shown in U.S. Pat. No. 4,683,486, "DRAM Cell and Array". In order to further reduce the size of the device, a transistor was formed within the confines of a trench capacitor, such as in U.S. Pat. No. 4,686,552, "Integrated Circuit Trench Cell" assigned to Motorola Inc.

Therefore, there exists a need in the industry for a improved methods of manufacturing trench cells which provide smaller, more compact cells.

Accordingly, it is an objective of the present invention to provide a DRAM cell having a trench capacitor which overcomes the above deficiencies.

Another object of the present invention is to provide a DRAM cell having a trench capacitor which has a reduced size.

Still another object of the present invention is to provide a DRAM utilizing a VMOS device.

SUMMARY OF THE INVENTION

A particular embodiment of the present invention consists of a DRAM cell formed in the trench of a trench capacitor. The trench is filled with a first layer of P silicon, a layer of N silicon, and a third layer of P silicon. A second trench is then etched through the third and second and into the first layers. The trench is then filed with a gate polysilicon and the appropriate contacts are made.

BRIEF DESCRIPTION OF THE DRAWINGS

FIGS. 1A-1D are cross-sectional process flow diagrams illustrating a fabrication of the present invention.

DETAILED DESCRIPTION OF THE DRAWINGS

Figure 1C:
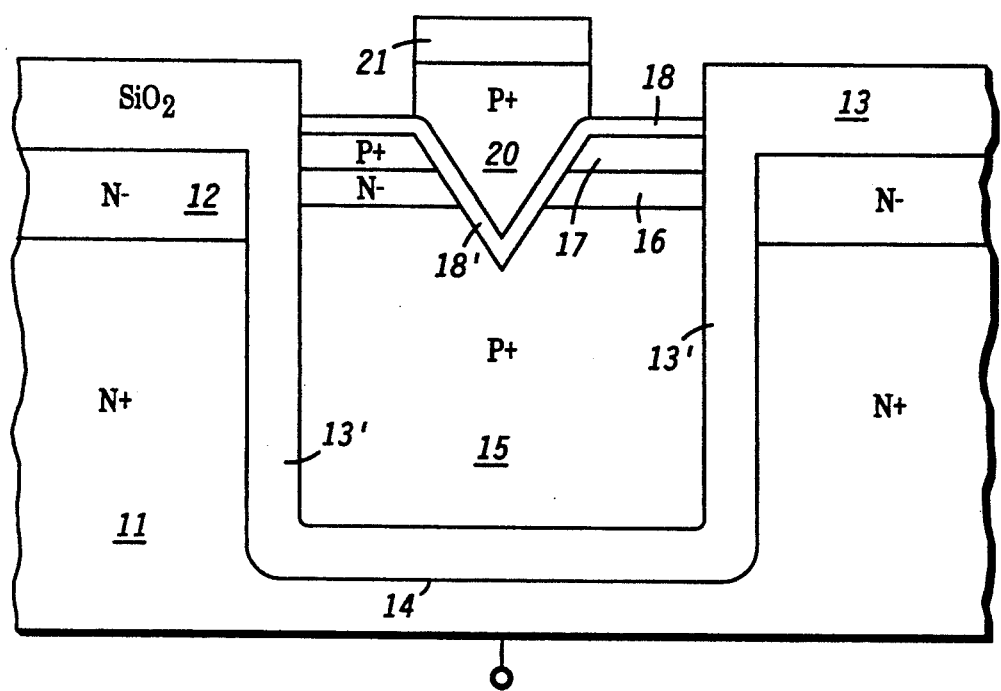

Referring to the diagram of FIG. 1A, the fabrication of a DRAM cell, generally designated 10, is illustrated. While the present description is illustrative of a PMOS type of DRAM cell, it will be apparent to those skilled in the art the same process may be utilized to produce a NMOS cell.

DRAM cell 10 is constructed by first forming an $N^+$-type substrate 11 having an $N^-$ epitaxial layer 12 deposited thereon. Alternatively, substrate 11 could be a heavily doped p-type material. A field oxide 13 is then grown on layer 12. Oxide layer 13 is masked and developed and a trench 14 is etched through layer 12 and into substrate 11.

Trench 14 is next oxidized forming a dielectric side wall layer 13'. A $P^+$ silicon layer 15 is then formed in trench 14 followed by $N^-$ and $P^+$ silicon layers 16 and 17. These silicon layers would preferably be epitaxially grown to form a single crystalline structure.

The wafer is then oxidized forming oxide layer 18 and nitride spacers 19 are formed adjacent trench 14.

Referring now to FIG. 1B, using nitride spacers as a mask, oxide layer 18 is etched followed by an etch of silicon layers 17, 16, and 15. This forms a second trench for a MOSFET channel region. As illustrated, this is a "V" shaped trench, but could be of any standard physical shape.

Nitride spacer 19 is then removed and the wafer is again oxidized forming a dielectric gate oxide 18' which is integrally formed with previous oxide layer 18, FIG. 1C. A polysilicon layer 20 is then deposited and doped (either in situ or after deposit) followed by a nitride layer 21. In addition, a metal later may be provided between layers 20 and 21 to reduce the sheet rho. Layers 20 and 21 are patterned and etched to form a gate.

Figure 1D:
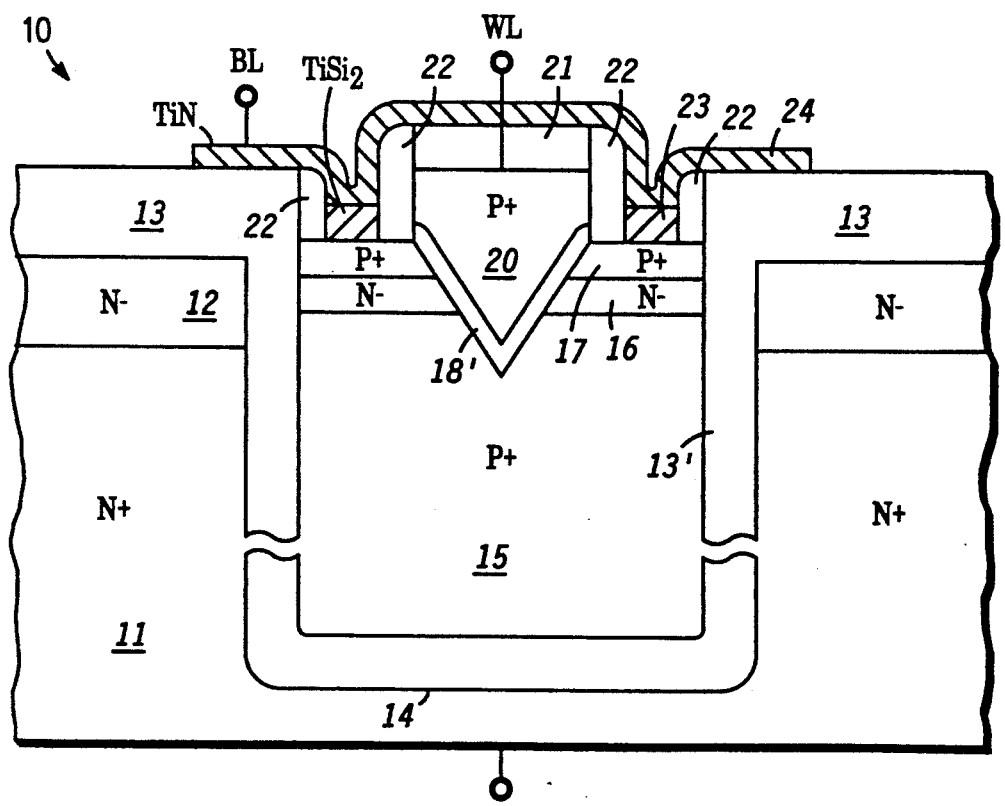

In the next step, FIG. 1D, another layer of oxide is deposited and etched leaving spacers 22 which will isolate polysilicon 20 from later conductive deposits. This oxide layer, in one preferred embodiment, is a low thermal oxide (LTO). A layer of titanium salicide ($TiSi_2$) is then deposited and etched to form contacts 23 with silicon 17. Alternatively, a first layer of titanium is deposited and heated. This forms a mono-silicide layer where the titanium is in contact with silicon. The titanium layer is then etched in an aqueous solution to remove the nonsilicide titanium portion. The titanium silicide (TiSi) is again heated and forms the titanium salicide ($TiSi_2$) layer. Finally, a layer of titanium nitride 24 is deposited and etched.

Titanium nitride layer 24 is utilized as the word line interconnect and polysilicon layer 20 is used as the bit line contact for cell 10.

The size of cell 10 is on the order of 1 micron square when manufactured using 0.30 micron design rules. This provides a gate 20 of approximately 0.35 microns in width which is spaced approximately 0.35 microns from the edge of trench wall 14.

Therefore, a method for forming a dynamic random access memory cell having a trench capacitor has been shown which reduced size and utilizes a VMOS transistor.

Thus, it will be apparent to one skilled in the art, upon reviewing the foregoing description, that there has been provided in accordance with the invention, a process and method that fully satisfy the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:

1. A method of forming a dynamic random access memory cell in a substrate of a first conductivity comprising the steps of:
    growing an epitaxial layer of said first conductivity on a surface of said substrate;
    forming a first trench through said epitaxial layer and into said substrate;
    lining said first trench with a first dielectric layer;
    depositing a first silicon layer having a second conductivity type in said trench;

depositing a second silicon layer having said first conductivity type on said first silicon layer in said trench;

depositing a third silicon layer having said second conductivity type on said second silicon layer in said trench;

etching through said third and second and into said first silicon layers, leaving a peripheral portion of said third and second layers to form a second trench;

lining said second trench with a second dielectric layer; and depositing a gate polysilicon layer having said second conductivity type in said second trench.

2. The method of claim 1 further comprising the step of forming an epitaxial layer of a polysilicon having said first conductivity on a surface of said substrate prior to forming said first trench.

3. The cell of claim 1 wherein said first conductivity type is an N-type conductivity and said second conductivity type is a P-type conductivity.

4. The cell of claim 1 wherein said first and second dielectric layers consist of silicon dioxide.

5. The cell of claim 1 wherein said first, second, and third silicon layers are polysilicon layers.

6. The cell of claim 1 wherein said first, second, and third silicon layers are epitaxially grown silicon layers.

7. A method of forming a dynamic random access memory cell in a substrate of a first conductivity comprising the steps of:

forming a first trench in said substrate;
lining said first trench with a first dielectric layer;
depositing a first silicon layer having a second conductivity type in said trench;
depositing a second silicon layer having said first conductivity type on said first silicon layer in said trench;
depositing a third silicon layer having said second conductivity type on said second silicon layer in said trench;
forming a second trench through said third and second and into said first silicon layers;
lining said second trench with a second dielectric layer;
depositing a gate polysilicon layer having said second conductivity type in said second trench;
depositing a nitride layer over said gate polysilicon layer;
forming a dielectric spacer about an exposed side of said gate polysilicon, leaving portions of said third silicon layer exposed; and
depositing a first conductor on said exposed portions of said third silicon layer.

8. A method of forming a dynamic random access memory cell in a substrate having a first conductivity and a first concentration, said method comprising the steps of:

growing an epitaxial layer of said fist conductivity and a second concentration on a surface of said substrate;
forming a first trench through said epitaxial layer and into said substrate;
lining said first trench with a first dielectric layer;
depositing a first silicone layer having a second conductivity type in said trench;
depositing a second silicon layer having said first conductivity type on said second silicon layer in said trench;
forming a second trench having a varying cross sectional width through said third and second and into said fit silicone layers, wherein the cross sectional width of said trench is narrow in said first silicon layer relative to said third silicon layer;
lining said second trench with a second dielectric layer; and
depositing a gate polysilicon layer having said second conductivity type in said second trench.

9. The method of claim 8 wherein said first conductivity type is an N-type conductivity and said second conductivity type is a P-type conductivity.

10. The method of claim 9 wherein said first concentration is an $N^+$ concentration and said second concentration is an $N^-$ concentration.

11. The method of claim 8 wherein said first and second dielectric layers consist of silicon dioxide.

12. The method of claim 8 wherein said first, second, and third silicon layers are polysilicon layers.

13. The method of claim 8 wherein said first, second, and third silicon layers are epitaxially grown silicon layers.

14. A method of forming a dynamic random access memory cell in a substrate having a first conductivity and a first concentration, said method comprising the steps of:

growing an epitaxial layer of said first conductivity and a second concentration on a surface of a polysilicon substrate;
forming a first trench through said epitaxial layer and into said substrate;
lining said first trench with a first dielectric layer;
depositing a first silicon layer having a second conductivity type in said trench;
depositing a second silicon layer having said first conductivity type on said first silicon layer in said trench;
depositing a third silicon layer having said second conductivity type on said second silicon layer in said trench;
forming a second trench having a varying cross sectional width through said third and second and into said first silicon layers, wherein the cross sectional width of said trench is narrow in said first silicon layer relative to said third silicon layer;
lining said second trench with a second dielectric layer; and
depositing a gate polysilicon layer having said second conductivity type in said second trench.

15. A method of forming a dynamic random access memory cell in a substrate of a first conductivity comprising the steps of:

forming a first trench in a polysilicon substrate;
lining said first trench with a first dielectric layer;
depositing a first silicon layer having a second conductivity type in said trench;
depositing a second silicon layer having said first conductivity type on said first silicon layer in said trench;
depositing a third silicon layer having said second conductivity type on said second silicon layer in said trench;
etching through said third and second and into said first silicon layers, leaving a peripheral portion of said third and second layers to form a second trench;
lining said second trench with a second dielectric layer; and
depositing a gate polysilicon layer having said second conductivity type in said second trench.

* * * * *